(12) United States Patent
Bhatkar et al.

(10) Patent No.: US 9,613,897 B2
(45) Date of Patent: Apr. 4, 2017

(54) INTEGRATED CIRCUITS INCLUDING MAGNETIC CORE INDUCTORS AND METHODS FOR FABRICATING THE SAME

(71) Applicant: GLOBALFOUNDRIES Singapore Pte. Ltd., Singapore (SG)

(72) Inventors: Mahesh Bhatkar, Singpaore (SG); Lulu Peng, Singapore (SG); Wanbing Yi, Singapore (SG); Juan Boon Tan, Singapore (SG); Luke England, Saratoga Springs, NY (US)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 127 days.

(21) Appl. No.: 14/537,942

(22) Filed: Nov. 11, 2014

(65) Prior Publication Data

US 2016/0133565 A1    May 12, 2016

(51) Int. Cl.
| | |
|---|---|
| H01F 5/00 | (2006.01) |
| H01F 27/28 | (2006.01) |
| H01L 23/522 | (2006.01) |
| H01F 27/24 | (2006.01) |
| H01F 1/147 | (2006.01) |
| H01F 1/14 | (2006.01) |
| H01L 49/02 | (2006.01) |

(52) U.S. Cl.
CPC .......... *H01L 23/5227* (2013.01); *H01F 1/14* (2013.01); *H01F 1/14708* (2013.01); *H01F 1/14766* (2013.01); *H01F 27/24* (2013.01); *H01F 27/2804* (2013.01); *H01L 28/10* (2013.01); *H01F 2027/2809* (2013.01); *H01L 2924/0002* (2013.01)

(58) Field of Classification Search
USPC ........................................................ 336/200
See application file for complete search history.

(56) References Cited

U.S. PATENT DOCUMENTS 7,262,680 B2    8/2007   Wang

OTHER PUBLICATIONS

Lee et al., "Fabrication and Analysis of High Performance Integrated Solenoid Inductor With Magnetic Core", IEEE Transactions on Magnetics, Nov. 2008, pp. 4089-4095, vol. 44, No. 11.

*Primary Examiner* — Elvin G Enad
*Assistant Examiner* — Ronald Hinson
(74) *Attorney, Agent, or Firm* — Lorenz & Kopf, LLP

(57) ABSTRACT

Magnetic core inductors implemented on integrated circuits and methods for fabricating such magnetic core inductors are disclosed. An exemplary magnetic core inductor includes a bottom magnetic plate that includes a center portion and first, second, third, and fourth extension portions extending from the center portion. The exemplary magnetic core inductor includes an interlayer dielectric layer disposed over the bottom magnetic plate, and within the interlayer dielectric layer, first, second, third, and fourth via trenches extending above a respective one of the first, second, third, and fourth extension portions, and a fifth via trench extending above the center portion. The magnetic core inductor further includes a stacked-ring inductor coil including a plurality of inductor rings surrounding the fifth via trench and a top magnetic plate including a center portion and first, second, third, and fourth extension portions extending from the center portion.

20 Claims, 4 Drawing Sheets

INTEGRATED CIRCUITS INCLUDING MAGNETIC CORE INDUCTORS AND METHODS FOR FABRICATING THE SAME

TECHNICAL FIELD

The present disclosure is generally directed to integrated circuits and methods for fabricating integrated circuits. More particularly, the present disclosure is directed to magnetic core inductors implemented on integrated circuits and methods for fabricating such magnetic core inductors.

BACKGROUND

The majority of present day integrated circuits are implemented by using a plurality of interconnected field effect transistors (FETs), also called metal oxide semiconductor field effect transistors (MOSFETs), or simply MOS transistors. Such semiconductor devices are used in many electronic and other applications. Semiconductor devices include integrated circuits that are formed on semiconductor wafers by depositing many types of thin films of material over the semiconductor wafers, and patterning the thin films of material to form the integrated circuits.

One such application of semiconductor devices is in cell phones and laptop computers, which are playing important roles in our everyday lives, and the demand for more portable electronic devices continues to increase rapidly. This growing demand is currently driving the integration or embedding of passive components in semiconductor devices, which would replace off-chip discrete modular assemblies. Meanwhile, various approaches of integration in system-on-a-chip (SoC) and system-in-package (SiP) circuits are gaining much attention. However, the poor properties of integrated inductors have been a critical factor limiting the overall performance of radio-frequency (RF) circuits and hence the realization of RF SoC or SiP circuits.

Inductors are passive devices that are widely used in many applications. Integrated inductors are usually formed using conventional semiconductor fabrication processes. While improvements in performance of inductors are constantly sought, there is also a demand in semiconductor device technology to integrate many different functions on a single chip, e.g., manufacturing various types of active and passive devices on the same die. However, such integration creates additional challenges that need to be overcome. For example, conventional inductive structures require large surface areas or have limited performance. For aggressive integration, it is essential to have a low surface area along with a high quality factor.

The use of a magnetic core with high permeability in the integrated inductor has been proposed in the prior art to significantly increase the inductance by the relative permeability of the magnetic material used. This, in turn, can significantly reduce the device area and the coil resistance needed to meet the inductance requirement. However, prior art magnetic core inductors still suffer from several technical challenges. For example, in U.S. Pat. No. 7,262,680 B2 to Albert H. Wang, it was proposed to use an on-chip inductor device for integrated circuits that utilizes coils on a plurality of metal layers of the integrated circuit with electrical connectors between the coils and a magnetic core for the inductor of stacked vias running between the coils. This structure, however, may be found to suffer from a relatively low inductance density, along with the possibility of electromagnetic interference because the magnetic field generated by the inductor could penetrate through the semiconductor substrate underneath. As a further example, in Lee et al., IEEE TRANSACTIONS ON MAGNETICS, Vol. 44, No. 11, P. 4089 (November 2008), the authors proposed integrated inductors using a solenoid design with a single magnetic layer. This structure, however, like the one proposed by Wang, may suffer from a relatively low inductance density, and has not found wide application in portable electronic devices.

Therefore, it will become apparent to those skilled in the art that there remains a present and continuing need for the provision of improved integrated inductor structures for use in SoC and SiC circuits. The inductor structures would desirably exhibit a relatively high inductance density in addition to having protection against electromagnetic interference due to the magnetic field generated. It would be desirable for such structures to be easily fabricated using existing semiconductor fabrication processes, such as conventional back-end-of-line (BEOL) processing techniques. Still further, other desirable features and characteristics of the subject matter will become apparent from the subsequent detailed description of the subject matter and the appended claims, taken in conjunction with the accompanying drawings and this background of the disclosure.

BRIEF SUMMARY

Magnetic core inductors implemented on integrated circuits and methods for fabricating such magnetic core inductors are disclosed. In accordance with one exemplary embodiment, the magnetic core inductor includes a bottom magnetic plate that includes a center portion and first, second, third, and fourth extension portions extending from the center portion. The magnetic core inductor further includes an interlayer dielectric layer disposed over the bottom magnetic plate and, within the interlayer dielectric layer, first, second, third, and fourth via trenches extending above a respective one of the first, second, third, and fourth extension portions, and a fifth via trench extending above the center portion. Each of the first through fifth via trenches includes a magnetic material along sidewalls thereof and is filled with a high dielectric breakdown material. The magnetic core inductor further includes a stacked-ring inductor coil including a plurality of inductor rings surrounding the fifth via trench and a top magnetic plate including a center portion and first, second, third, and fourth extension portions extending from the center portion that lie over respective ones of the center, first, second, third, and fourth extension portions of the bottom magnetic plate.

In accordance with another exemplary embodiment, disclosed is a method for fabricating an integrated circuit that includes a magnetic core inductor. The method includes forming a bottom magnetic plate layer over a back-end-of-line stack layer, patterning the bottom magnetic plate layer into a shape that includes a center portion and first, second, third, and fourth extension portions extending from the center portion, and forming an interlayer dielectric layer with a stacked-ring inductor coil therein over the patterned bottom magnetic plate layer. The stacked-ring inductor coil is formed over the center portion of the bottom magnetic plate layer and includes a plurality of inductor rings. The method further includes etching first, second, third, fourth, and fifth via trenches into the interlayer dielectric layer, wherein the first through fourth via trenches are formed over respective ones of the first through fourth extension portions of the patterned bottom magnetic plate layer, and wherein the fifth via trench is formed over the center portion of the patterned bottom magnetic layer and within the inductor rings of the stacked-ring inductor coil. The method includes forming magnetic material sidewall liners along sidewalls of each of the first through fifth via trenches. Still further, the method includes forming a top magnetic plate layer over the interlayer dielectric layer, patterning the top magnetic plate layer into a shape that includes a center portion and first, second, third, and fourth extension portions extending from the center portion that align with respective ones of the first, second, third, fourth, and center portions of the patterned bottom magnetic plate layer, and filling the first through fifth trenches with a high dielectric breakdown material.

In accordance with yet another exemplary embodiment, the magnetic core inductor includes first, second, and third via trenches formed within an interlayer dielectric layer and formed substantially linearly with respect to one another, wherein the second via trench is disposed linearly between the first and second via trenches, wherein a first portion of the interlayer dielectric layer separates the first via trench from the second via trench, and wherein a second portion of the interlayer dielectric layer separates the second via trench from the third via trench. The magnetic core inductor further includes a magnetic material layer disposed at a bottom portion of each of the via trenches, along sidewalls of each of the via trenches, underneath the first and second portions of interlayer dielectric layer, and above the first and second portions of the interlayer dielectric layer. Still further, the magnetic core inductor includes a stacked-ring inductor coil including a plurality of inductor rings formed within the first and second portions of the interlayer dielectric layer and surrounding the second via trench.

This brief summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE FIGURES

The present disclosure will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the present disclosure are generally directed magnetic core inductors implemented on integrated circuits and methods for fabricating such magnetic core inductors. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

As used herein, it will be understood that when an element or layer is referred to as being "on," "connected to" or "coupled to" another element or layer, it may be directly on, connected to, or coupled to the other element or layer, or intervening elements or layers may be present. Further, spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

Figure 1A:
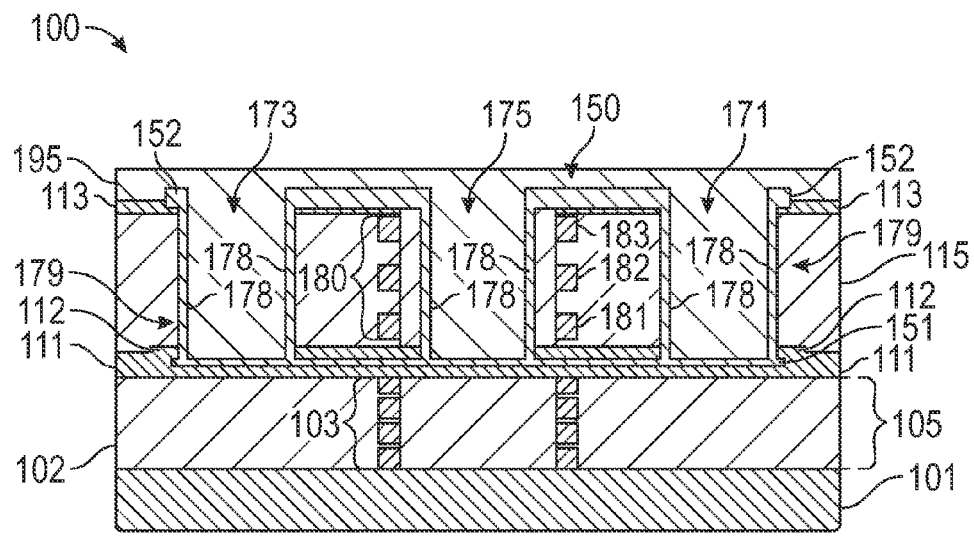
FIG. 1A is a cross-sectional view of an exemplary integrated circuit including a magnetic core inductor in accordance with various embodiments of the present disclosure.
Figure 1B:
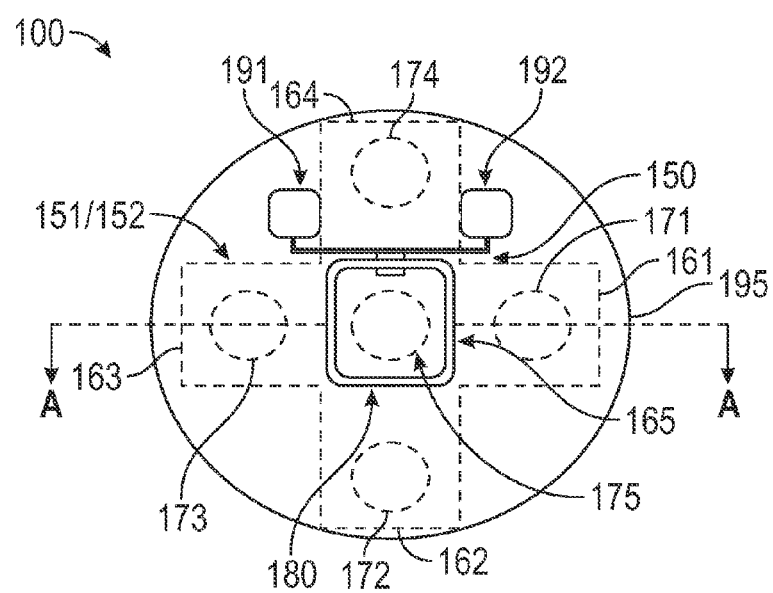
FIG. 1B is a top view of the exemplary integrated circuit shown in FIG. 1A.

Turning now to the Figures, FIG. 1A is a cross-sectional view of an exemplary integrated circuit 100 including a magnetic core inductor 150 in accordance with various embodiments of the present disclosure, and FIG. 1B is a top view of the exemplary integrated circuit 100 shown in FIG. 1A. In an embodiment, the integrated circuit structure 100 includes a semiconductor substrate 101 (shown particularly in FIG. 1A) made of a semiconductor material. The semiconductor material is preferably a silicon material as typically used in the semiconductor industry, e.g., relatively pure silicon as well as silicon admixed with other elements such as germanium, carbon, and the like. Alternatively, the semiconductor material may be germanium, gallium arsenide, or the like. The semiconductor material may be provided as a bulk semiconductor substrate, or it may be provided on a silicon-on-insulator (SOI) substrate, which includes a support substrate, an insulator layer on the support substrate, and a layer of silicon material on the insulator layer.

Although not separately illustrated, the semiconductor substrate may have formed therein a plurality of isolation features, such as shallow trench isolation (STI) features or local oxidation of silicon (LOCOS) features. The isolation features may define and isolate the various microelectronic elements (not shown). Examples of the various microelectronic elements that may be formed in the substrate include transistors (e.g., metal oxide semiconductor field effect transistors (MOSFET): bipolar junction transistors (BJT); resistors; diodes; capacitors; inductors; fuses; or other suitable elements. Various processes are performed to form the various microelectronic elements including deposition, etching, implantation, photolithography, annealing, or other suitable processes. The microelectronic elements are interconnected to form the integrated circuit device, such as a logic device, memory device, radio frequency (RF) device, input/output (I/O) device, system-on-chip (SoC) device, combinations thereof, or other suitable types of devices.

The integrated circuit structure 100 illustrated in FIGS. 1A and 1B includes an inter-layer dielectric (ILD) layer 102 and a metallization layer(s) 103 within the ILD layer 102 (shown particularly in FIG. 1A). By the term "within," it is meant that a top surface of the metallization layer(s) 103 is below or is substantially coplanar with a top surface of the ILD layer 102, and the metallization layer 103 extends downward into the ILD layer 102. The ILD layer 102 may be formed of one or more low-k dielectric materials, un-doped silicate glass (USG), silicon nitride, silicon oxynitride, or other commonly used materials. The dielectric constants (k value) of the low-k dielectric materials may be less than about 3.9, for example, less than about 2.8. The metallization layer(s) 103 may be formed of a conductive metal, such as copper or copper alloys.

One skilled in the art will realize the formation details of the ILD layer 102 and the metallization layer 103. For example, conventional BEOL fabrication techniques may be used to form the layers 102 and 103. In this manner, layers 102 and 103 will hereinafter be referred to together as a conventional BEOL "stack" 105. BEOL stack 105 is thus understood to include any of the conventional BEOL features, such as metallization layers and metal interconnects, as would be conventionally be formed during BEOL processes in the fabrication of integrated circuits.

The magnetic core inductor 150 of the present disclosure may be formed over conventional BEOL stack 105. To provide electrical separation between the BEOL stack 105 and the magnetic core inductor 150, a first insulating layer 111 may be provided over the BEOL stack 105 and underneath the magnetic core inductor 150. The first insulating layer 111 may be formed of one or more low-k dielectric materials, USG, silicon nitride, silicon oxynitride, or other commonly used materials. The thickness of the first insulating layer 111 (i.e., in a direction perpendicular to the plane of the upper surface of the BEOL stack 105) varies depending on the overall dimensions of the integrated circuit 100, but in some embodiments may be from about 0.5 to about 2.0 microns, such as about 1.0 micron.

The magnetic core inductor 150 includes a bottom magnetic plate 151 that is disposed over and in direct adjacent contact with the first insulating layer 111. The bottom magnetic plate 151 may have a shape or "footprint" over the first insulating layer 111 that may generally be described as "plus-shaped" ("+-shaped") having four extensions 161-164 originating from a common center 165, each of the four extensions 161-164 being separated from one another by angles of about 90 degrees (possibly from about 45 degrees to about 135 degrees, in other embodiments). FIG. 1B best illustrates the shape of the bottom magnetic plate 151 using a dashed line to show the plus-shaped footprint over the first insulating layer 111. The bottom magnetic plate may be formed of any magnetic material that is known to be used in magnetic core inductors, such as, for example, Co, Fe, Ni, Mo, NiFe, NiFeMo, CoNbZr, CoMoNiFe, FeAlO, and FeSi, and combinations thereof. The thickness of the bottom magnetic plate 151 varies depending on the overall dimensions of the magnetic core inductor 150, but in some embodiments may be about 0.5 to about 2.0 microns, such as about 1.0 micron. The width of the bottom magnetic plate 151 (such as from extension 161 to 163 or from extension 162 to 164) also varies depending on the overall dimensions of the magnetic core inductor 150, but in some embodiments may be about 50 microns to about 100 microns, such as about 70 microns.

Each extension 161-164 of the bottom magnetic plate 151 has a via channel or trench (respectively, 171-174) formed thereover. Additionally, the center 165 has a further via channel or trench 175 formed thereover. In this configuration, via trenches 173, 175, and 171 may be formed in a substantially co-linear configuration, and via trenches 172, 175, and 174 may be formed in a substantial co-linear configuration. FIG. 1B best illustrates the shape of the via channels or trenches 171-175 using a dashed line to show their footprint over the bottom magnetic plate 151. For example, in some embodiments, the via channels or trenches 171-175 may be substantially cylindrical in configuration, as illustrated. The via channels or trenches 171-175 have a diameter that varies depending on the overall dimensions of the magnetic core inductor 150, but in some embodiments may be about 5 microns to about 20 microns. The via channels or trenches 171-175 are spaced apart from one another by a distance (center to center) that also varies depending on the overall dimensions of the magnetic core inductor 150, but in some embodiments may be about 20 microns to about 40 microns. The via channels or trenches may be formed within a further ILD layer 115 that is separated from the bottom magnetic plate 151 by a second insulating layer 112. ILD layer 115 and the second insulating layer 112 may each, independently, be formed of one or more low-k dielectric materials, un-doped silicate glass, silicon nitride, silicon oxynitride, or other commonly used materials. The thickness of the second insulating layer 112 varies depending on the overall dimensions of the magnetic core inductor 150, but in some embodiments may be from about 0.5 to about 2.0 microns, such as about 1.0 micron. The thickness of the ILD layer 115 also varies depending on the overall dimensions of the magnetic core inductor 150, but in some embodiments may be from about 10 to about 15 microns, such as about 12 microns.

Each of the via channels or trenches 171-175 has its sidewalls 179 lined with magnetic material, which in some embodiments may be the same magnetic material used to form bottom magnetic plate 151. Accordingly, each of the via channels or trenches 171-175 includes a magnetic material liner 178, as best shown in FIG. 1A. Given the positioning of each of the via channels or trenches 171-175 over the bottom magnetic plate 151, the magnetic material liner 178 is formed to contact with the bottom magnetic plate 151 at the bottom of each via trench 171-175.

The center via channel or trench 175 includes a plurality of stacked (i.e., in a direction perpendicular to the plane of the upper surface of the second insulating layer 112) inductor "rings" 181-183 (three rings are shown for purposes of illustration, but it will be appreciated that more or fewer may be formed to accommodate desired inductance parameters for a particular implementation) that encircle or otherwise surround the center via channel or trench 175. The other via channels or trenches 171-174, in an embodiment, do not include any inductor rings therearound. The rings 181-183 are thus formed within the ILD layer 115. The rings 181-183 are not in direct contact with the sidewall magnetic material liner 178 of the via trench 175, but rather are spaced apart therefrom by a distance that may range from about 1 micron to about 5 microns. The rings 181-183 need not be circular (although they may be), but rather as shown best by the outline in FIG. 1B may be characterized as generally rectangular or square with rounded edges. As shown in FIG. 1B, the rings collectively may be referred to as inductor coil 180. Inductor coil 180 may be formed of any conductive material that is used in the fabrication of conductive integrated circuit structures. For example, in one embodiment, the inductor coil 180 may be formed of a conductive metal, such as copper or copper alloys. In the conventional manner, each ring 181-183 is connected to its closest two adjacent rings (one above, one below) by a connecting via (not separately shown) that is made of the same conductive material as the rings 181-183. Further, also in the conventional manner, both the bottom ring (i.e., 181) and the top ring (i.e., 183) are connected by further connecting vias and/or connecting lines (not separately shown) to conductive terminal pads 191, 192, which may be located over the magnetic core inductor 150 as shown in FIG. 1B, to provide the appropriate electrical connection to the magnetic core inductor 150. As shown, in one embodiment, the terminal pads 191, 192 may be located outside of the footprint of the previously-described plus-shaped bottom magnetic plate 151.

The magnetic core inductor 150 further includes a top magnetic plate 152, which is disposed over the ILD layer 115. The top magnetic plate 152, in some embodiments, may be separated from the ILD layer 115 by a third insulating layer 113. The third insulating layer 113 may be formed of one or more low-k dielectric materials, un-doped silicate glass, silicon nitride, silicon oxynitride, or other commonly used materials. The thickness of the third insulating layer 113 varies depending on the overall dimensions of the magnetic core inductor 150, but in some embodiments may be from about 0.5 to about 2.0 microns, such as about 1.0 micron. The top magnetic plate 152 may be formed of a magnetic material, which in some embodiments may be the same magnetic material used to form bottom magnetic plate 151. The thickness of the top magnetic plate 152 varies depending on the overall dimensions of the magnetic core inductor 150, but in some embodiments may be about 0.5 to about 2.0 microns, such as about 1.0 micron. The "footprint" of the top magnetic plate 152 may be substantially the same as the bottom magnetic plate 151, i.e., be "plus-shaped" as described above, having extensions 161-164, and the top magnetic plate 152 may be aligned to directly lie over the bottom magnetic plate 151 such that the top and bottom magnetic plates 151 and 152 form the same (i.e., co-aligned) "footprint" over the BEOL stack 105 (with the exception that the top magnetic plate 152 is not formed over the via channels or trenches 171-175, as illustrated in FIG. 1A). Given the positioning of each of the via channels or trenches 171-175 within the ILD layer 115, the magnetic material liner 178 is formed to contact with the top magnetic plate 152 at the top of each via trench 171-175. In this manner, the bottom magnetic plate 151, the magnetic material liner 178, and the top magnetic plate 152 form a continuous magnetic layer that extends above and below the ILD layer 115, as well as along the sidewalls 178 of the via channels or trenches 171-175 formed within the ILD layer 115, all within the aforementioned "plus-shaped" footprint.

As further shown in FIGS. 1A and 1B, a high dielectric breakdown material such as a polyimide material layer 195 may be used to fill the trenches 171-175 and to cover the top magnetic plate 152. In this manner, the polyimide material layer 195 may cover the bottom magnetic plate at the bottom of the trenches 171-175, the liner 178, and may further cover the top magnetic plate 152. Additionally, the polyimide material layer 195 may extend outside of the plus-shaped magnetic plate footprint, and provide for dielectric separation of the terminals 191, 192 from the rest of the magnetic core inductor 150.

Figure 2:
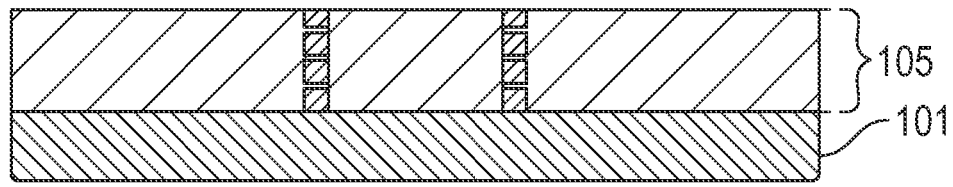
FIGS. 2-10 illustrate various method steps in the fabrication of the exemplary integrated circuit shown in FIGS. 1A and 1B in accordance with various embodiments of the present disclosure.

In accordance with an embodiment, a method of fabrication of the integrated circuit structure illustrated in FIGS. 1A and 1B is provided by the illustrations shown in FIGS. 2 through 10. Beginning with FIG. 2, depicted is a partially-fabricated integrated circuit structure that includes the semiconductor substrate 101 and the convention BEOL stack 105. The semiconductor substrate 101, including all of its associated features such as the transistors (e.g., metal oxide semiconductor field effect transistors (MOSFET); bipolar junction transistors (BJT); resistors; diodes; capacitors; inductors; fuses; or other suitable elements, may be formed using conventional front-end-of-line and middle-of-line processes such as deposition, etching, implantation, photolithography, annealing, or other suitable processes. Additionally, the BEOL stack 105 may be formed using conventional BEOL processes to provide any of the conventional BEOL features, such as metallization layers and metal interconnects, as would be conventionally be formed during BEOL processes in the fabrication of integrated circuits. Thus, the method of fabricating the integrated circuit including the magnetic core inductor follows conventional front, middle, and back-end fabrication processes, and may be easily incorporated with conventional BEOL fabrication facilities.

Figure 3:
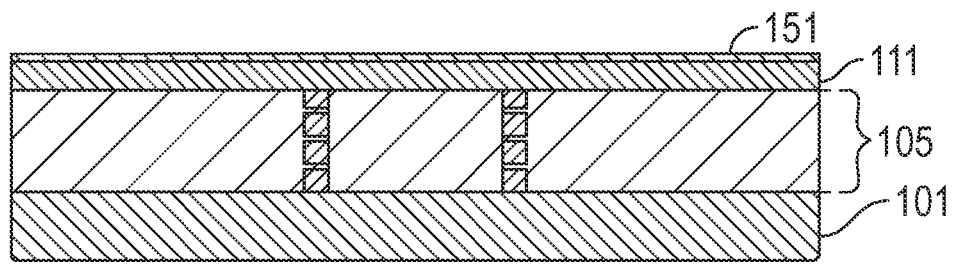

Turning now to FIG. 3, the method continues with the steps of depositing the first insulating layer 111 and the bottom magnetic plate 151. Layers 111 and 151 may be deposited using any conventional deposition technique, such as by chemical vapor deposition (CVD), atomic layer deposition (ALD), low pressure chemical vapor deposition (LP-CVD), or plasma enhanced chemical vapor deposition (PECVD), among others that are well-known in the art.

Figure 4:
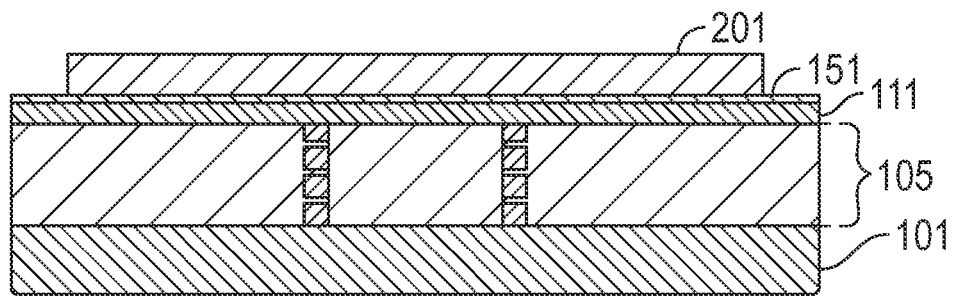
Figure 5:
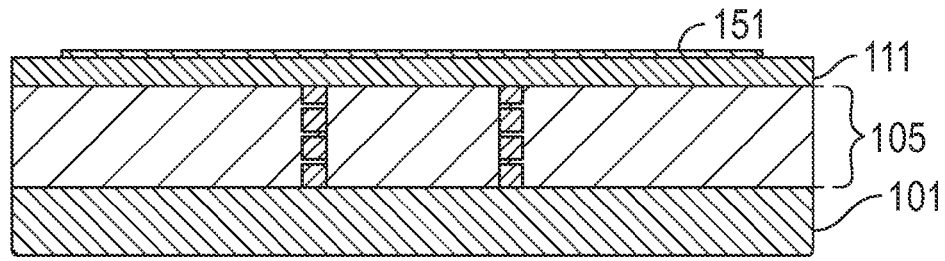
Figure 6:
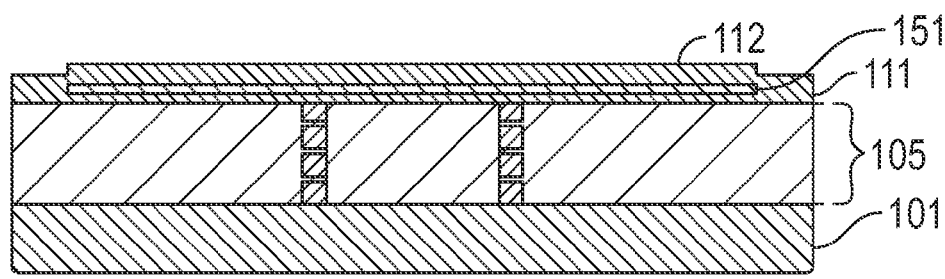

The method continues as shown in FIG. 4 with the patterning of the bottom magnetic plate 151 into the shape of the above-described "plus" shape. In this regard, the plus-shaped configuration of bottom magnetic plate 151 is formed using known photolithographic patterning and etching procedures. That is, a photoresist layer 201 is deposited and then is exposed to an image pattern and treated with a developing solution to form pattern openings within the photoresist layer 201, leaving the remaining photoresist material disposed in the plus shape over layer 151. With the photoresist layer 201 thus patterned, the deposited bottom magnetic plate layer 151 may be etched to the plus-shaped form, for example using any conventional etching technique such as wet or dry etching, as shown in FIG. 5. The remaining photoresist material may then be stripped away. As further shown in connection with FIG. 6, the second insulating layer 112 is deposited over the patterned bottom magnetic plate 151 using conventional deposition techniques to cover an entirety of the bottom magnetic plate 151.

Figure 7:
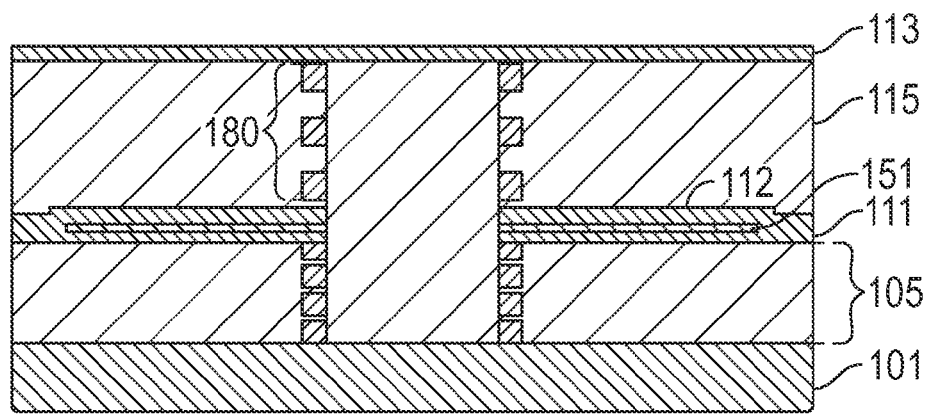

The fabrication process then continues as shown in FIG. 7 with the formation of the further ILD layer 115 and the inductor coil 180. Although the formation of various stacked-ring inductor coil configurations has been demonstrated in the prior art, an exemplary method therefor is briefly provided herein for purposes of completeness. A first portion (i.e., a portion of its thickness) of ILD layer 115 is deposited. A hole for a contact plug through the first portion is then etched or otherwise provided and the contact hole plugged or filled with a conductive material. The first ring layer is then deposited and etched if necessary to create the first ring (i.e., 181) thereon. Thus, the first ring layer is formed in the annular shape of a portion of the inductor coil rings by appropriate patterned deposition and etching. A second portion of the ILD layer 115 is then laid down, followed by a second hole, and second ring layer. This process repeats for as many ring layers form the inductor coil 180 (for example, three as shown in the exemplary configuration of FIGS. 1A and 1B). The third insulating layer 113 is then deposited using conventional deposition techniques over the inductor coil 180 and over the further ILD layer 115, as additionally shown in FIG. 7.

Figure 8:
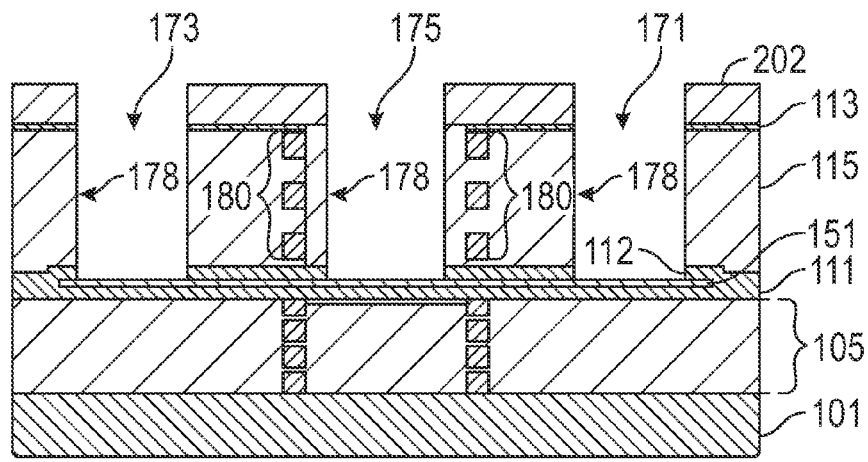

Turning now to FIG. 8, a photoresist layer 202 is deposited and then is exposed to an image pattern and treated with a developing solution to form pattern openings within the photoresist layer 202, leaving the remaining photoresist material disposed over layer 113 having patterned openings corresponding with the shape of the via channels or trenches 171-175. With the photoresist layer 202 thus patterned, the insulating layer 113 and the further ILD layer 115 may be etched to form the via channels or trenches 171-175, for example using any conventional etching technique such as wet or dry etching, as shown in FIG. 8. The remaining photoresist material may then be stripped-away.

Figure 9:
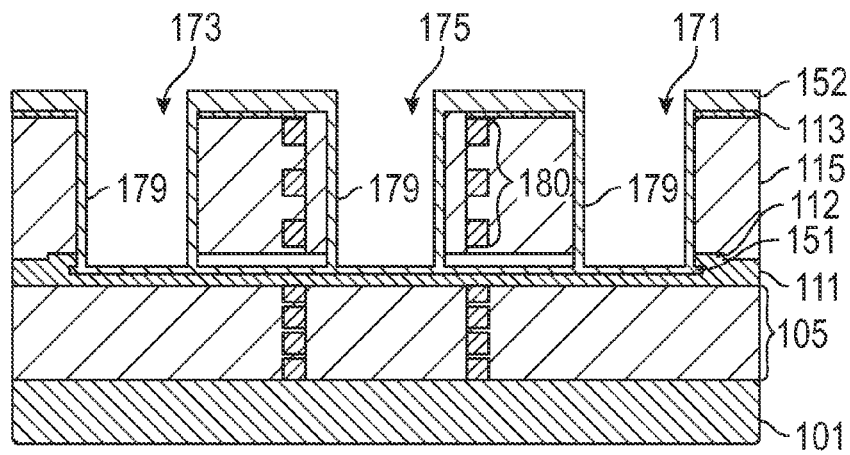
Figure 10:
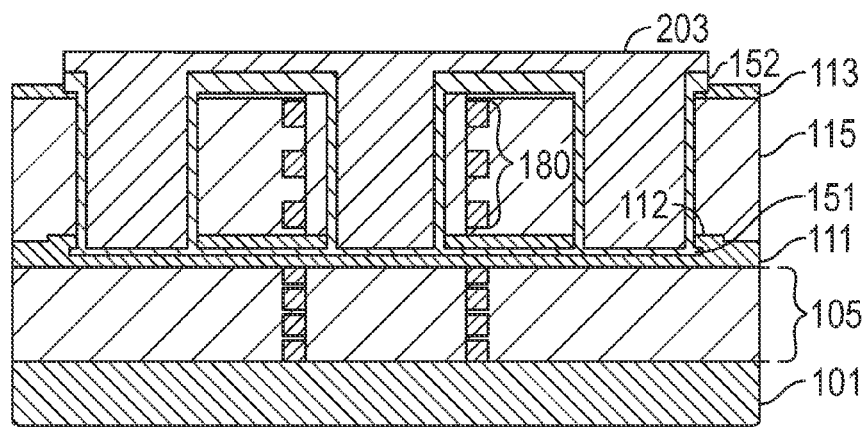

Continuing with the description of the exemplary fabrication process in connection with FIG. 9, additional magnetic material is deposited using conformal deposition techniques over the non-etched portions of third insulating layer 113, along the sidewalls 179 of the via channels or trenches 171-175, and over the exposed portions of the bottom magnetic plate 151 to form top magnetic plate 152 and magnetic sidewall liners 178. The method continues as shown in FIG. 10 with the pattering of the top magnetic plate 152 into the shape of the above-described "plus" shape. In this regard, the plus-shaped configuration of top magnetic plate 152 using a photoresist layer 203 that is deposited and then is exposed to an image pattern and treated with a developing solution to form pattern openings within the photoresist layer 203, leaving the remaining photoresist material disposed over layer 113 in the plus shape. With the photoresist layer 203 thus patterned, the deposited top magnetic plate layer 152 may be etched to the plus-shaped form, for example using any conventional etching technique such as wet or dry etching, as shown in FIG. 10. The remaining photoresist material may then be stripped-away.

The exemplary fabrication method concludes with the blanket deposition of the polyimide material layer 195 into the via channels or trenches 171-175 and over the top patterned magnetic plate layer 152 and over the third insulating layer 113, resulting in the structure substantially as presented in FIGS. 1A and 1B. The terminal pads 191, 192 are formed after the deposition of the polyimide material layer 195, in the appropriate area to provide electrical connection leading to the inductor coil 180 (i.e., with the above-described vias and connector lines).

As such, described herein are embodiments of improved magnetic core inductors implemented on integrated circuits and methods for fabricating such magnetic core inductors. The described magnetic core inductors provide an improvement over the state of the art by exhibiting a relatively high inductance density in addition to having protection against electromagnetic interference due to the magnetic field generated. The described magnetic core inductors are also easily fabricated using existing semiconductor fabrication processes, such as conventional BEOL processing techniques.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration in any way. Rather, the foregoing detailed description will provide those skilled in the art with a convenient road map for implementing an exemplary embodiment, it being understood that various changes may be made in the function and arrangement of elements described in an exemplary embodiment without departing from the scope as set forth in the appended claims and their legal equivalents.

What is claimed is:

1. An integrated circuit comprising a magnetic core inductor, the magnetic core inductor comprising:
   a bottom magnetic plate comprising a center portion and first, second, third, and fourth extension portions extending from the center portion;
   an interlayer dielectric layer disposed over the bottom magnetic plate;
   within the interlayer dielectric layer, first, second, third, and fourth via trenches extending above a respective one of the first, second, third, and fourth extension portions, and a fifth via trench extending above the center portion, each of the first through fifth via trenches comprising a magnetic material along sidewalls thereof and being filled with a high dielectric breakdown material;
   a stacked-ring inductor coil comprising a plurality of inductor rings surrounding the fifth via trench; and
   a top magnetic plate comprising a center portion and first, second, third, and fourth extension portions extending from the center portion that lie over respective ones of the center, first, second, third, and fourth extension portions of the bottom magnetic plate.

2. The integrated circuit of claim 1, wherein the magnetic core inductor lies over a back-end-of-line stack that comprises one or more metallization layers and one or more dielectric layers.

3. The integrated circuit of claim 2, wherein the back-end-of-line stack lies over a semiconductor substrate that comprises one or more of transistors, resistors, diodes, capacitors, inductors, and fuses.

4. The integrated circuit of claim 1, wherein the bottom magnetic plate, the magnetic material along the sidewalls of the via trenches, and the top magnetic plate each independently comprise a material that is selected from the group consisting of: Co, Fe, Ni, Mo, NiFe, NiFeMo, CoNbZr, CoMoNiFe, FeAlO, FeSi, and combinations thereof.

5. The integrated circuit of claim 1, wherein adjacent extension portions of the bottom and top magnetic plate are separated from one another by an angle of from about 45 degrees to about 135 degrees.

6. The integrated circuit of claim 5, wherein adjacent extension portions of the bottom and top magnetic plate are separated from one another by an angle of about 90 degrees, and wherein the bottom and top magnetic plates are substantially plus-shaped.

7. The integrated circuit of claim 1, wherein the via trenches are substantially cylindrically shaped.

8. The integrated circuit of claim 1, wherein the stacked-ring inductor coil is substantially circularly shaped, or is shaped in the form of a rectangle having rounded edges or a square having rounded edges.

9. The integrated circuit of claim 1, wherein the stacked-ring inductor coil is separated from the fifth via trench by portions of the interlayer dielectric layer.

10. The integrated circuit of claim 1, wherein each of the first, second, third, and fourth via trenches are not surrounded by any inductor rings.

11. The integrated circuit of claim 1, wherein the inductor stacked-ring inductor coil comprises at least three inductor rings.

12. The integrated circuit of claim 1, wherein the inductor rings comprise a copper material or a copper alloy.

13. The integrated circuit of claim 1, wherein the high dielectric breakdown material comprises a polyimide material.

14. The integrated circuit of claim 1, further comprising contact terminal pads that are electrically coupled with the stacked-ring inductor coil disposed over the high dielectric breakdown material.

15. A method for fabricating an integrated circuit that comprises a magnetic core inductor, the method comprising:
- forming a bottom magnetic plate layer over a back-end-of-line stack layer;
- patterning the bottom magnetic plate layer into a shape that comprises a center portion and first, second, third, and fourth extension portions extending from the center portion;
- forming an interlayer dielectric layer with a stacked-ring inductor coil therein over the patterned bottom magnetic plate layer, wherein the stacked-ring inductor coil is formed over the center portion of the bottom magnetic plate layer and comprises a plurality of inductor rings;
- etching first, second, third, fourth, and fifth via trenches into the interlayer dielectric layer, wherein the first through fourth via trenches are formed over respective ones of the first through fourth extension portions of the patterned bottom magnetic plate layer, and wherein the fifth via trench is formed over the center portion of the patterned bottom magnetic layer and within the inductor rings of the stacked-ring inductor coil;
- forming magnetic material sidewall liners along sidewalls of each of the first through fifth via trenches;
- forming a top magnetic plate layer over the interlayer dielectric layer;
- patterning the top magnetic plate layer into a shape that comprises a center portion and first, second, third, and fourth extension portions extending from the center portion that align with respective ones of the first, second, third, fourth, and center portions of the patterned bottom magnetic plate layer; and
- filling the first through fifth trenches with a high dielectric breakdown material.

16. The method of claim 15, further comprising forming the back-end-of-line stack layer over a semiconductor substrate layer.

17. The method of claim 15, further comprising forming conductive terminal pads over the high dielectric breakdown material.

18. The method of claim 15, wherein forming the interlayer dielectric layer with the stacked-ring inductor coil therein comprises forming an interlayer dielectric layer comprising at least three inductor rings.

19. The method of claim 15, wherein forming bottom magnetic plate layer, the magnetic material sidewall liners, and the top magnetic plate layer each comprise, independently, forming layers of a material that is selected from the group consisting of: Co, Fe, Ni, Mo, NiFe, NiFeMo, CoNbZr, CoMoNiFe, FeAlO, FeSi, and combinations thereof.

20. An integrated circuit comprising a magnetic core inductor, the magnetic core inductor comprising:
- first, second, and third via trenches formed within an interlayer dielectric layer and formed in a substantially co-linear configuration with respect to one another, wherein the second via trench is disposed linearly between the first and second via trenches, wherein a first portion of the interlayer dielectric layer separates the first via trench from the second via trench, and wherein a second portion of the interlayer dielectric layer separates the second via trench from the third via trench;
- a magnetic material layer disposed at a bottom portion of each of the via trenches, along sidewalls of each of the via trenches, underneath the first and second portions of interlayer dielectric layer, and above the first and second portions of the interlayer dielectric layer; and
- a stacked-ring inductor coil comprising a plurality of inductor rings formed within the first and second portions of the interlayer dielectric layer and surrounding the second via trench.

* * * * *